US005837428A

United States Patent [19]

Huang et al.

[11] Patent Number: 5,837,428

[45] Date of Patent: Nov. 17, 1998

[54] ETCHING METHOD FOR EXTENDING I-LINE PHOTOLITHOGRAPHY TO 0.25 MICRON LINEWIDTH

[75] Inventors: Yuan-Chang Huang; Shu-Chih Yang, both of Hsin-Chu, Taiwan

[73] Assignee: Taiwan Semiconductor Manufacturing Compnay Ltd., Hsin-Chu, Taiwan

[21] Appl. No.: 701,605

[22] Filed: Aug. 22, 1996

[51] Int. Cl.[6] ................................ G03F 7/00; G03F 7/26

[52] U.S. Cl. ........................... 430/313; 430/316; 216/47; 428/142; 428/585; 428/671; 428/713; 428/717; 428/721; 428/725; 428/950; 428/952

[58] Field of Search .................................... 438/585, 671, 438/717, 725, 713, 952, 950, 142, 721; 428/193, 346, 585, 671, 717, 725, 713, 952, 950, 142, 721; 430/313, 316, 317; 216/47

[56] References Cited

U.S. PATENT DOCUMENTS

| | | | |
|---|---|---|---|
| 4,620,986 | 11/1986 | Yau et al. | 438/671 |
| 4,910,122 | 3/1990 | Arnold et al. | 438/952 |
| 5,326,727 | 7/1994 | Kook et al. | 438/725 |
| 5,472,564 | 12/1995 | Nakamura et al. | 216/51 |
| 5,514,621 | 5/1996 | Tabara | 438/585 |
| 5,545,588 | 8/1996 | Yoo | 438/671 |

OTHER PUBLICATIONS

S. Wolf, "Silicon Processing for The VLSI Era" vol. 1, Lattice Press, Sunset Beach, CA, p. 581, 1968.

*Primary Examiner*—Janis L. Dote

*Attorney, Agent, or Firm*—George O. Saile; Stephen B. Ackerman; Alek P. Szecsy

[57] ABSTRACT

A method for forming a patterned layer within an integrated circuit. There is first provided a substrate having formed thereupon a blanket target layer. Formed upon the blanket target layer is a blanket focusing layer, where the blanket focusing layer is formed from an organic material and where the blanket focusing layer is susceptible to a reproducible negative etch bias within a first etch method employed in etching the blanket focusing layer to form a patterned focusing layer. There is then formed upon the blanket focusing layer a blanket photoresist layer which is photo-exposed and developed to form a patterned photoresist layer. There is then etched through the first etch method the blanket focusing layer to form the patterned focusing layer while employing the patterned photoresist layer as a first etch mask layer. The patterned focusing layer so formed has the reproducible negative etch bias with respect to the patterned photoresist layer. Finally, the blanket target layer is etched through a second etch method to form a patterned target layer while employing the patterned focusing layer as a second etch mask layer. When: (1) the patterned photoresist layer has a linewidth dimension about 0.33 to about 0.35 microns; (2) the reproducible negative etch bias is from about −0.07 to about −0.09 microns; and (3) the second etch method does not have a reproducible second etch bias which substantially compensates the reproducible negative etch, a patterned target layer, such as a gate electrode within a field effect transistor (FET), of linewidth dimension as narrow as about 0.25 microns may be obtained.

14 Claims, 3 Drawing Sheets

ETCHING METHOD FOR EXTENDING I-LINE PHOTOLITHOGRAPHY TO 0.25 MICRON LINEWIDTH

BACKGROUND OF THE INVENTION

1. Field of the Invention

The present invention relates generally to photolithographic methods through which patterned layers are formed within integrated circuits. More particularly, the present invention relates to photolithographic methods through which patterned layers of linewidth dimension as narrow as about 0.25 microns may be formed employing i-line near ultra-violet (NUV) (ie: 365 nanometer (nm)) photoexposure radiation within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

As integrated circuit technology has advanced, there has been a continuing and correlating trend towards decreasing linewidth dimensions of electrical circuit elements and patterned layers through which are formed those advanced integrated circuits. The decreasing linewidth dimensions have typically traditionally been effected principally through decreasing the wavelength of photoexposure radiation employed in forming patterned photoresist layers which are employed in defining the linewidth dimensions of those electrical circuit elements and patterned layers. Currently, photoexposure radiation is typically in the near ultra-violet (NUV) (ie: 365 nanometers (nm)) wavelength region for forming electrical circuit elements and patterned layers of linewidth dimension typically as low as about 0.33 to about 0.35 microns, while the most advanced photoexposure tooling typically employs a photoexposure radiation in the deep ultra-violet (DUV) (ie: 254 nanometers (nm)) wavelength region or x-ray wavelength region for forming electrical circuit elements and patterned layers of linewidth dimensions in the deep submicron region as low as about 0.10 microns.

While the trend towards decreasing wavelength of photoexposure radiation as a means for providing electrical circuit elements and patterned layers of decreased linewidth dimensions within advanced integrated circuits will most certainly continue, it nonetheless becomes important to provide methods and materials through which the evolution from the current generations of integrated circuits having formed therein electrical circuit elements and patterned layers defined by photoexposure tooling employing a near ultra-violet (NUV) (ie: 365 nanometers (nm)) photoexposure radiation wavelength to future generations of integrated circuits having formed therein electrical circuit elements and patterned layers defined by advanced generations of photoexposure tooling employing a deep ultra-violet (DUV) (ie: 254 nanometers (nm)) photoexposure radiation wavelength may be smoothly facilitated. In that regard, it is typically desirable to characterize to the extent possible, through relevant research and development activities, advanced electrical circuit elements and patterned layers of decreased linewidth dimensions at the earliest possible opportunity prior to committing production of integrated circuits having formed therein those advanced electrical circuit elements and patterned layers of decreased linewidth dimensions to advanced photoexposure tooling. Among other advantages, such pre-production characterization allows for efficient use of advanced photoexposure tooling when initiating production of the advanced integrated circuits within a manufacturing environment. In particular, within advanced integrated circuits having formed therein advanced field effect transistors (FETs) defined by gate electrodes of diminished linewidth dimensions, it is typically desirable to fully characterize those advanced field effect transistors (FETs) prior to production of those advanced field effect transistors (FETs) since the gate electrode linewidth within a field effect transistor (FET) defines the channel width within the field effect transistor (FET) which in part defines the operational characteristics of the field effect transistor (FET). It is thus towards providing a method for forming within advanced integrated circuits advanced electrical circuit elements and patterned layers having decreased linewidth dimensions without the need for employing advanced photoexposure tooling in forming those advanced electrical circuit elements and patterned layers that the present invention is generally directed.

Novel etch methods through which may be defined the dimensions within integrated circuits of patterned layers such as patterned polysilicon layers which may be employed as gate electrodes within field effect transistors (FETs) are known in the art. For example, Nakamura et al. in U.S. Pat. No. 5,472,564 discloses a method for controlling the taper of a patterned polysilicon layer formed within an integrated circuit. The taper is controlled by means of controlling the temperature at which the patterned polysilicon layer is etched from a blanket polysilicon layer while employing a hydrogen bromide or bromine containing reactive ion etch (RIE) plasma etchant gas composition. In addition, Tabara in U.S. Pat. No. 5,514,621 discloses a method for forming from a blanket polysilicon layer within an integrated circuit a patterned polysilicon layer by employing a silicon oxide mask formed in-situ upon the blanket polysilicon layer. Finally, reactive ion etch (RIE) etchant gases appropriate for etching layers formed of various materials within integrated circuits are in general disclosed by S. Wolf et al. in Silicon Processing for the VLSI Era, Vol. 1: Process Technology, Lattice Press (Sunset Beach, Calif.; 1968), pg. 581.

Desirable in the art are additional methods through which linewidth dimensions of electrical circuit elements and patterned layers within advanced integrated circuits may be controlled. Particularly desirable are methods through which linewidth dimensions of electrical circuit elements and patterned layers within advanced integrated circuits may be controlled to provide electrical circuit elements and patterned layers of linewidth dimension as narrow as about 0.25 microns while employing near ultra-violet (NUV) (ie: 365 nanometer (nm)) photoexposure radiation. Most particularly desirable are additional methods through which advanced field effect transistors (FETs) having gate electrodes of linewidth dimension as narrow as about 0.25 microns may be formed within advanced integrated circuits while employing near ultra-violet (NUV) (ie: 365 nanometer (nm)) photoexposure radiation. It is towards these goals that the present invention is specifically directed.

SUMMARY OF THE INVENTION

A first object of the present invention is to provide a method for forming for use within advanced integrated circuits electrical circuit elements and patterned layers of linewidth dimensions as low as about 0.25 microns.

A second object of the present invention is to provide a method in accord with the first object of the present invention, where the electrical circuit elements and patterned layers are formed employing near ultra-violet (NUV) (ie: 365 nanometer (nm)) photoexposure radiation.

A third object of the present invention is to provide a method in accord with the first object of the present invention and the second object of the present invention, which method is readily manufacturable.

In accord with the objects of the present invention, there is provided by the present invention a method for forming for use within an advanced integrated circuit a patterned layer. To practice the method of the present invention, there is first provided a substrate having formed thereupon a blanket target layer. Formed upon the blanket target layer is a blanket focusing layer, where the blanket focusing layer is formed from an organic material and where the blanket focusing layer is susceptible to a reproducible negative etch bias within a first etch method employed in forming from the blanket focusing layer a patterned focusing layer. There is then formed upon the blanket focusing layer a blanket photoresist layer which is photoexposed and developed to form a patterned photoresist layer. There is then etched through the first etch method the blanket focusing layer to form the patterned focusing layer while employing the patterned photoresist layer as a first etch mask layer. The patterned focusing layer so formed has the reproducible negative etch bias with respect to the patterned photoresist layer. Finally, the blanket target layer is etched through a second etch method to form a patterned target layer while employing the patterned focusing layer as a second etch mask layer. The patterned target layer has a reproducible second etch bias with respect to the patterned focusing layer, where the reproducible second etch bias does not substantially compensate the reproducible negative etch bias.

When: (1) the blanket photoresist layer is photoexposed through a near ultra-violet (NUV) (ie: 365 nanometer (nm)) photoexposure radiation method and developed to yield a patterned photoresist layer of linewidth dimension about 0.33 to about 0.35 microns; and (2) the reproducible etch bias of the patterned focusing layer with respect to the patterned photoresist layer is from about −0.07 to about −0.09 microns, a patterned target layer, such a gate electrode within a field effect transistor (FET), of linewidth dimension as narrow as about 0.25 microns may be obtained.

Through the method of the present invention there may be formed for use within advanced integrated circuits electrical circuit elements and patterned layers of linewidth as narrow as about 0.25 microns while employing near ultra-violet (NUV) (ie: 365 nanometer (nm)) photoexposure radiation. By employing: (1) a blanket focusing layer through which there is formed a patterned focusing layer having a reproducible negative etch bias with respect to a patterned photoresist layer which is employed as a first etch mask layer in patterning the patterned focusing layer from the blanket focusing layer; and (2) a blanket photoresist layer which may be photoexposed through a near ultra-violet (NUV) (ie: 365 nanometer (nm)) photoexposure radiation method and developed to yield a patterned photoresist layer of linewidth dimension about 0.33 to about 0.35 microns, there may be formed a patterned target layer, such as a gate electrode within a field effect transistor (FET). When the reproducible negative etch bias is: (1) not otherwise compensated; and (2) in the range of from about −0.07 to about −0.09 microns, the patterned target layer, such as the gate electrode within the field effect transistor (FET), may be formed with a linewidth as narrow as about 0.25 microns.

The method of the present invention is readily manufacturable. As is disclosed within the preferred embodiment of the method of the present invention which is directed towards forming within a field effect transistor (FET) for use within an integrated circuit a polysilicon or polycide gate electrode of linewidth dimension as narrow as about 0.25 microns while employing a near ultra-violet (NUV) (ie: 365 nanometer (nm)) photoexposure radiation method, the method of the present invention may be practiced through methods and materials as are known in the art of integrated circuit fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
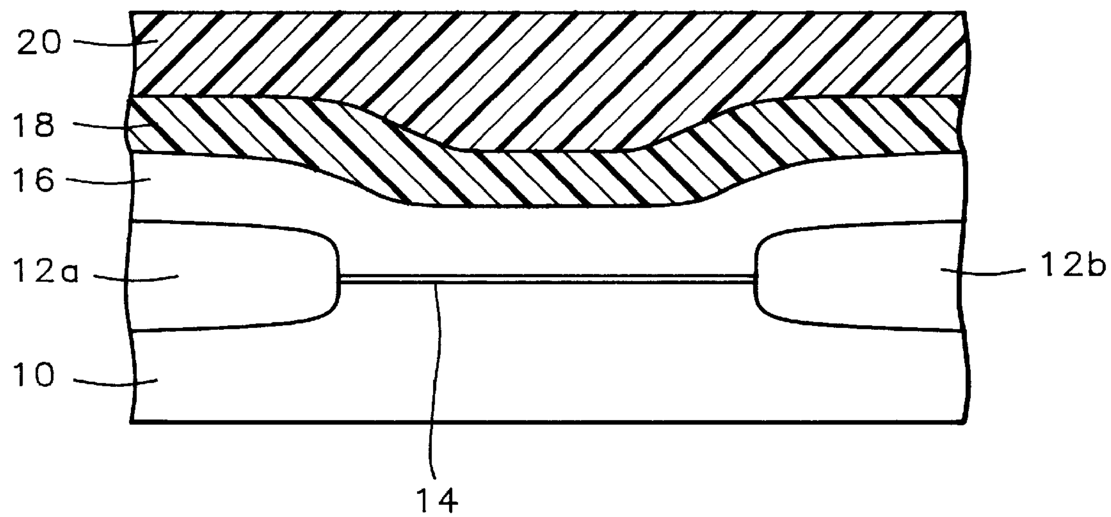
FIG. 1 to FIG. 5 show a series of schematic cross-sectional diagrams illustrating the results of progressive stages in forming within a field effect transistor (FET) for use within an integrated circuit a gate electrode of linewidth dimension as narrow as about 0.25 microns while employing a near ultra-violet (NUV) (ie: 365 nanometers (nm)) photoexposure radiation method through the preferred embodiment of the method of the present invention.

The present invention provides a method for forming for use within an integrated circuit a patterned layer, where the patterned layer may be formed of a linewidth as narrow as about 0.25 microns while employing a near ultra-violet (NUV) (ie: 365 nanometer (nm)) photoexposure radiation method. The method of the present invention achieves this goal by employing a blanket focusing layer formed beneath a patterned photoresist layer employed in defining the patterned layer from a blanket layer, where the blanket focusing layer is formed from an organic material and where a patterned focusing layer formed from the blanket focusing layer is susceptible to a reproducible negative etch bias with respect to the patterned photoresist layer when etching through a first etch method, while employing the patterned photoresist layer as a first etch mask layer, the patterned focusing layer from the blanket focusing layer. The patterned focusing layer having the reproducible negative etch bias is then employed as a second etch mask layer in a second etch method when forming the patterned layer from the blanket layer. Thus, when the patterned photoresist layer has been formed through a near ultra-violet (NUV) (ie: 365 nanometer (nm)) photoexposure radiation method to yield a patterned photoresist layer of linewidth dimension from about 0.33 to about 0.35 microns, and the reproducible negative etch bias of the patterned focusing layer with respect to the patterned photoresist layer is from about −0.07 to about −0.09 microns, the patterned layer may be formed with a linewidth dimension as narrow as about 0.25 microns while employing the near ultra-violet (NUV) (ie: 365 nanometer (nm)) photoexposure radiation method, provided that the second etch method does not exhibit a reproducible second etch bias which substantially compensates the reproducible negative etch bias.

The method of the present invention may be employed in forming electrical circuit elements and patterned layers within integrated circuits including but not limited to dynamic random access memory (DRAM integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

Although the preferred embodiment of the method of the present invention discloses the method of the present invention as employed in forming a polysilicon or polycide gate electrode within a field effect transistor (FET) for use within an integrated circuit, it is understood by a person skilled in the art that the method of the present invention may also be employed in forming any of several other patterned target layers from blanket target layers for use within an integrated circuit. Thus, the method of the present invention may be employed in forming patterned target layers from blanket target layers including but not limited to blanket conductor layers, blanket insulator layers, blanket semiconductor layers and blanket photoactive layers. Typically, although not exclusively, the blanket target layer from which is formed the patterned target layer through the method of the present invention will have a thickness of from about 500 to about 10000 Angstroms. In addition, although the preferred embodiment of the method of the present invention discloses a blanket focusing layer and a patterned focusing layer formed from an anti-reflective coating (ARC) material, as is further understood by a person skilled in the art the blanket focusing layer and patterned focusing layer employed within the present invention may be formed of any material provided that the blanket focusing layer when etched through a first etch method provides a patterned focusing layer with a reproducible negative etch bias with respect to a patterned photoresist layer employed in defining the patterned focusing layer. While it is possible that any of several materials as are known in the art will fulfill foregoing characteristics, the blanket focusing layer will in general be formed from an organic material. Typically and preferably, the blanket focusing layer will in general have a thickness of from about 600 to about 2000 Angstroms.

Referring now to FIG. 1 to FIG. 5, there is shown a series of schematic cross-sectional diagrams illustrating the results of progressive stages in forming within a field effect transistor (FET) for use within an integrated circuit a gate electrode through the preferred embodiment of the method of the present invention. Shown in FIG. 1 is a schematic cross-sectional diagram of the integrated circuit at its early stages of fabrication.

Shown in FIG. 1 is a semiconductor substrate 10 within and upon whose surface is formed a pair of isolation regions 12*a* and 12*b* which define the active region of the semiconductor substrate 10. Although semiconductor substrates are known in the art with either dopant polarity, various dopant concentrations and several crystallographic orientations, for the preferred embodiment of the method of the present invention, the semiconductor substrate 10 is preferably formed from a (100) silicon semiconductor substrate having a N- or P-doping. Similarly, although it is also known in the art that isolation regions may be formed within and/or upon semiconductor substrates to define active regions of those semiconductor substrates through several methods, including but not limited to isolation region growth methods and isolation region deposition/patterning methods, for the preferred embodiment of the method of the present invention, the isolation regions 12*a* and 12*b* are preferably formed within and upon the semiconductor substrate 10 through an isolation region growth method through which isolation regions 12*a* and 12*b* of silicon oxide are formed within and upon the semiconductor substrate 10.

Also shown in FIG. 1 is the presence of four layers which are formed upon or over the active region of the semiconductor substrate 10 and/or the isolation regions 12*a* and 12*b* which define the active region of the semiconductor substrate 10. The four layers are: (1) a blanket gate dielectric layer 14 formed upon the active region of the semiconductor substrate 10; (2) a blanket layer of gate electrode material 16 formed upon the blanket gate dielectric layer 14 and the isolation regions 12*a* and 12*b;* (3) a blanket focusing layer 18 formed upon the blanket layer of gate electrode material 16; and (4) a blanket photoresist layer 20 formed upon the blanket focusing layer 18. Of these four blanket layers, the blanket gate dielectric layer 14 and the blanket layer of gate electrode material 16 may be formed through methods and materials as are otherwise conventional in the art of integrated circuit fabrication.

For example, blanket gate dielectric layers may be formed within integrated circuits through methods, including but not limited to blanket gate dielectric layer growth methods and blanket gate dielectric layer deposition methods through which may be formed blanket gate dielectric layers typically formed of silicon oxide. In addition, blanket layers of gate electrode materials may be formed within integrated circuits through methods including but not limited to thermally assisted evaporation methods, chemical vapor deposition (CVD) methods and physical vapor deposition (VD) sputtering methods through which may be formed blanket layers of gate electrode materials formed from gate electrode materials including but not limited to metals, metal alloys, highly doped polysilicon and polycides (ie: highly doped polysilicon/metal silicide stacks).

For the preferred embodiment of the method of the present invention, the blanket gate dielectric layer 14 is preferably formed upon the active region of the semiconductor substrate 10 through a thermal oxidation method at a temperature of from about 800 to about 1000 degrees centigrade through which a portion of the active region of the semiconductor substrate 10 is consumed in forming the blanket gate dielectric layer 14 of silicon oxide. Typically, the blanket gate dielectric layer 14 of silicon oxide so formed is from about 50 to about 100 Angstroms in thickness. In addition, for the preferred embodiment of the method of the present invention, the blanket layer of gate electrode material 16 is preferably formed upon the blanket gate dielectric layer 14 and the isolation regions 12*a* and 12*b* through appropriate chemical vapor deposition (CVD) methods and physical vapor deposition (PVD) sputtering methods through which there is formed a blanket layer of gate electrode material 16 formed of highly doped polysilicon or a polycide (ie: highly doped polysilicon/metal silicide stack). Preferably, the blanket layer of gate electrode material 16 so formed is from about 1500 to about 3000 Angstroms in thickness.

With respect to the blanket focusing layer 18, the blanket focusing layer 18 provides value within the method of the present invention when the blanket focusing layer 18 is formed of a material which exhibits a negative etch bias in a first etch method with respect to a patterned photoresist layer which serves as a first etch mask layer in etching a patterned focusing layer from the blanket focusing layer 18. As is understood by a person skilled in the art, an etch bias within the context of the present invention is intended as a difference in linewidth between: (1) a second linewidth of a patterned layer formed from a blanket layer through use of an etch method; and (2) a first linewidth of a patterned etch mask layer employed when forming the patterned layer from the blanket layer through use of the etch method. A positive etch bias indicates that the second linewidth is wider than the first linewidth. A negative etch bias indicates that the second linewidth is narrower than the first linewidth. Thus within the method of the present invention, the choice of the material from which is formed the blanket focusing layer 18 is preferably undertaken within the context of the first etch method through which the blanket focusing layer 18 is etched to form a patterned focusing layer having a negative etch bias with respect to the patterned photoresist layer which is employed as a first etch mask layer in etching the patterned focusing layer from the blanket focusing layer 18. To a lesser extent, the choice of the material from which is formed the blanket focusing layer 18 may also preferably be undertaken within the context of the material from which is formed the patterned photoresist layer which is employed in forming the first etch mask layer.

Thus, although the blanket focusing layer 18 may be formed from any of several materials, including but not limited to organic materials and inorganic materials, provided that a reproducible negative etch bias is exhibited by the blanket focusing layer 18 when etching the blanket focusing layer 18 to form a patterned focusing layer, for the preferred embodiment of the method of the present invention, it has been found experimentally (as illustrated within the EXAMPLES described below) that the blanket focusing layer 18 is preferably formed of an organic material. For the preferred embodiment of the method of the present invention, the organic material employed in forming the blanket focusing layer 18 preferably also simultaneously serves as an anti-reflective coating (ARC) layer for patterning from the blanket photoresist layer 20 a patterned photoresist layer. Anti-reflective coatings (ARCs) may be formed from any of several organic polymer materials which intrinsically or extrinsically incorporate dye chromophores tuned to a particular wavelength of light whose reflection is desired to be attenuated. Such anti-reflective coatings (ARCs) are typically formed upon semiconductor substrates through spin coating of organic solvent solutions comprising the dye chromophore and the organic polymer material, as well as solvents and other additives, followed by thermal evaporation of the solvent. See, for example, Flaim et al., U.S. Pat. No. 5,368,989, the teachings of which are incorporated herein fully by reference. For the preferred embodiment of the method of the present invention, the blanket focusing layer 18 of the organic anti-reflective coating (ARC) material so formed is from about 600 to about 2000 Angstroms thick.

Finally, although the blanket photoresist layer 20 may in general be formed of any of several photoresist materials, including but not limited to positive photoresist materials, negative photoresist materials, novolak photoresist materials and poly-methyl-meth-acrylate EMMA) photoresist materials, the blanket photoresist layer 20 is preferably formed from a photoresist material which will not substantially impede forming a patterned focusing layer from the blanket focusing layer 18, where the patterned focusing layer has a reproducible negative etch bias with respect to a patterned photoresist layer formed from the blanket photoresist layer 20. Thus, with respect to the preferred embodiment of the method of the present invention, it has also been determined experimentally that the blanket photoresist layer 20 is preferably formed of a positive novolak photoresist material since positive novolak photoresist materials provide the foregoing characteristics while simultaneously being readily patterned employing a near ultra-violet (NUV) (ie: 365 nanometers (nm)) photoexposure radiation method. Preferably, the blanket photoresist layer 20 is from about 7000 to about 10000 Angstroms thick.

Figure 2:
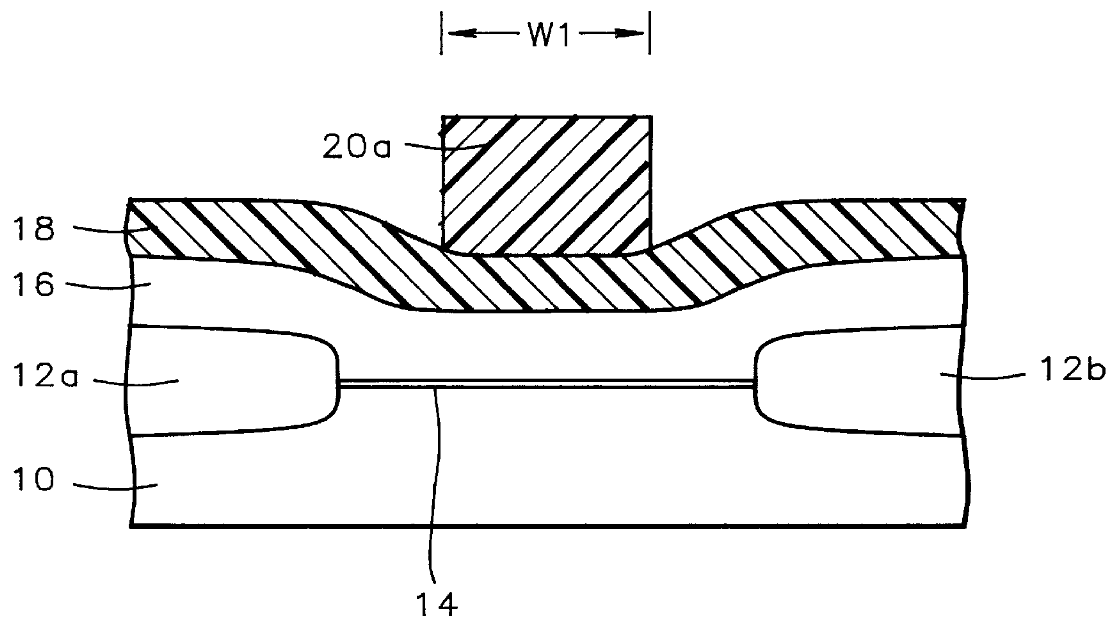

Referring now to FIG. 2, there is shown a schematic cross-sectional diagram illustrating the results of further processing of the integrated circuit whose schematic cross-sectional diagram is illustrated in FIG. 1. Shown in FIG. 2 is the results of: (1) patterning through a method employing near ultra-violet (NUV) (ie: 365 nanometer (nm)) photoexposure radiation; and (2) developing through methods as are conventional in the art, the blanket photoresist layer 20 to form the patterned photoresist layer 20*a*. As is illustrated in FIG. 2, the blanket photoresist layer 20 is photoexposed and developed to form the patterned photoresist layer 20*a* of a linewidth W1 upon the blanket focusing layer 18. When employing a near ultra-violet (NUV) (ie: 365 nanometer (nm)) photoexposure radiation method and subsequent development through methods as are conventional in the art, the linewidth W1 of the patterned photoresist layer 20*a* is typically no smaller than about 0.33 to about 0.35 microns.

Figure 3:
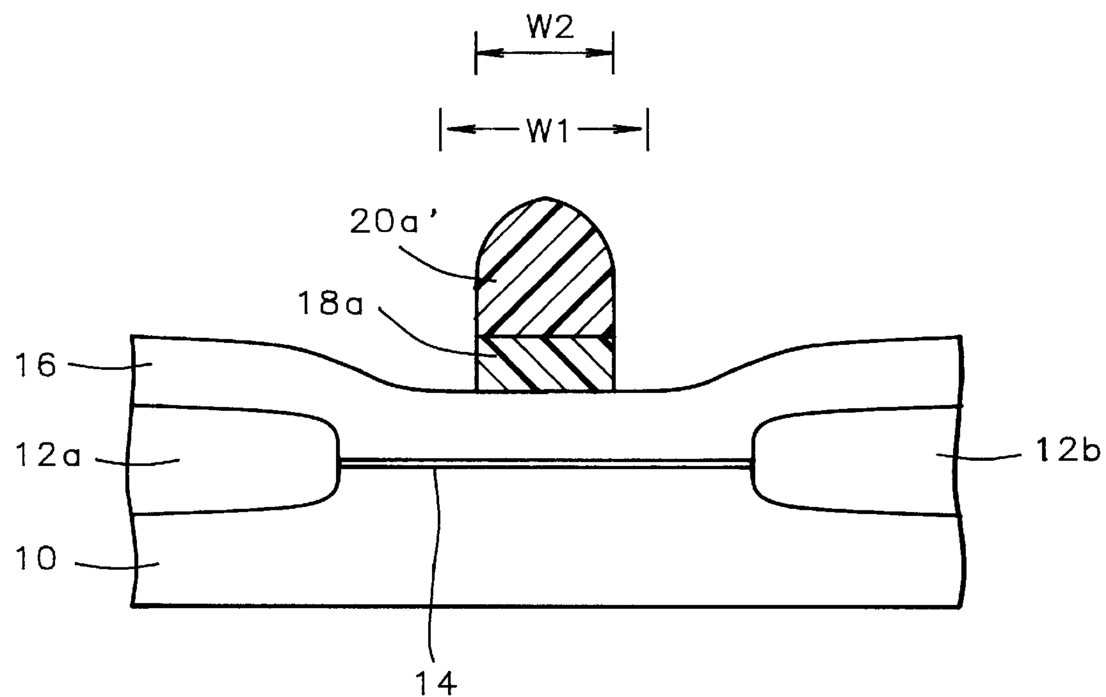

Referring now to FIG. 3 there is shown a schematic cross-sectional diagram illustrating the results of further processing of the integrated circuit whose schematic cross-sectional diagram is illustrated in FIG. 2. Shown in FIG. 3 is the results of patterning, through a first etch method, the blanket focusing layer 18 to yield the patterned focusing layer 18*a*. As is illustrated in FIG. 3, the patterned focusing layer 18*a* has a linewidth W2 less than the linewidth W1 of the patterned photoresist layer 20*a* as illustrated in FIG. 2. Thus, the patterned focusing layer 18*a* has a negative etch bias with respect to the patterned photoresist layer 20*a*. For the preferred embodiment of the method of the present invention, the patterned focusing layer 18*a* exhibits the linewidth W2 less than the linewidth W1 of the patterned photoresist layer 20*a* by means of a simultaneous co-etching of the patterned photoresist layer 20*a* to form an etched patterned photoresist layer 20*a*' along with the patterned focusing layer 18*a* when patterning the patterned focusing layer 18*a* from the blanket focusing layer 18. Within the preferred embodiment of the method of the present invention the etched patterned photoresist layer 20*a*' and the patterned focusing layer 18*a* will typically and preferably be of the same linewidth W2, although within the general method of the present invention a concurrence of the linewidth of the etched patterned photoresist layer 20*a*' and the patterned focusing layer 18*a* is not required.

Within the preferred embodiment of the method of the present invention, it has been found experimentally that the first etch method through which the patterned focusing layer 18*a* is formed from the blanket focusing layer 18 while employing the patterned photoresist layer 20*a* as a first etch mask layer is a first high density plasma (HDP) plasma etch method employing an etchant gas composition comprising oxygen, nitrogen and, optionally, hydrogen bromide. Preferably the first high density plasma (HDP) plasma etch method is undertaken at: (1) a reactor chamber pressure of from about 4 to about 10 mtorr; (2) a top radio frequency power of from about 200 to about 400 watts at a top radio frequency of 13.56 MHZ and a bottom radio frequency power of from about 50 to about 300 watts at a bottom radio frequency of 13.56 MHZ; (3) a substrate temperature of from about 30 to about 70 degrees centigrade; (4) a chamber temperature of from about 20 to about 50 degrees centigrade; and (5) a total etchant gas composition flow of from about 10 to about 35 standard cubic centimeters per minute (sccm), where the individual etchant gas flows are oxygen at about 5 to about 20 standard cubic centimeters per minute (sccm), nitrogen at about 5 to about 10 standard cubic centimeters per minute (sccm) and hydrogen bromide at about 0 to about 5 standard cubic centimeters per minute (sccm). More preferably, hydrogen bromide is provided at about 0 to about 2 standard cubic centimeters per minute (sccm). Less preferably, additional hydrogen bromide at higher flow rates may be employed to assure desirable sidewall etch profiles of the patterned focusing layer 18*a*. In order to provide optimal etching of the patterned focusing layer 18*a* from the blanket focusing layer 18, it has also been found experimentally that the volume ratio of etchant gas flows of oxygen to nitrogen is preferably from about 1:1 to about 2:1 and that the patterned focusing layer 18*a* is etched from the blanket focusing layer 18 for a time period which includes an overetch of from about 10 to about 30 percent. Under these conditions for the first etch method, the linewidth W2 for the patterned focusing layer 18*a* will typically and preferably have a negative etch bias with respect to the patterned photoresist layer 20*a* of from about −0.07 to about −0.09 microns, thus yielding a linewidth W2 for the patterned focusing layer 18*a* as narrow as about 0.25 microns.

Figure 4:
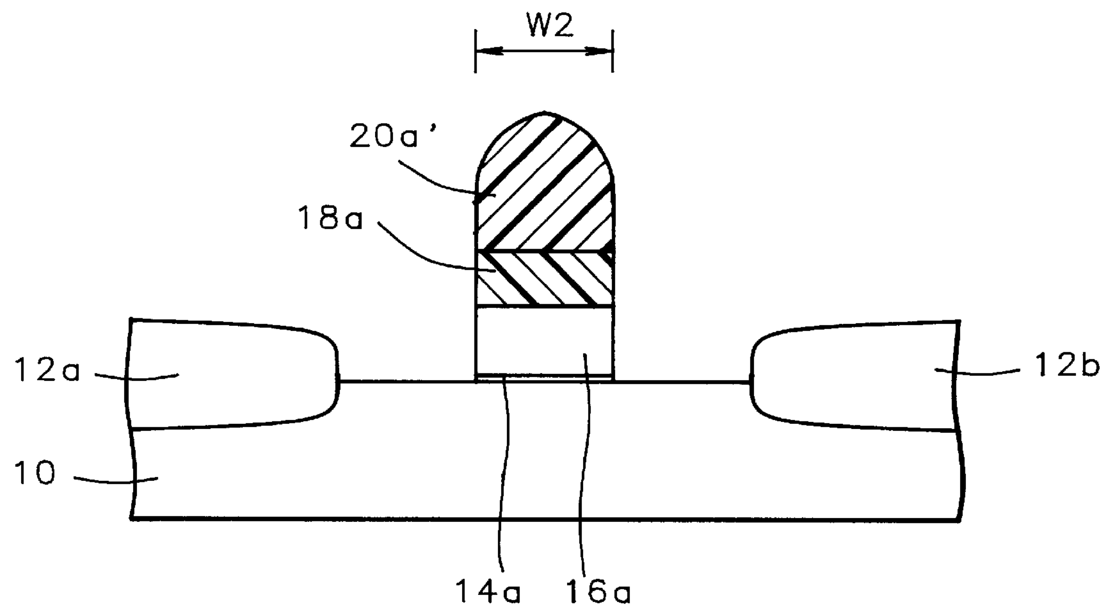

Referring now to FIG. 4 there is shown a schematic cross-sectional diagram illustrating the results of further processing of the integrated circuit whose schematic cross-sectional diagram is illustrated in FIG. 3. Shown in FIG. 4 is the results of: (1) patterning through a second etch method as is conventional in the art a gate electrode 16*a* from the blanket layer of gate electrode material 16 while employing the etched patterned photoresist layer 20*a*' and the patterned focusing layer 18*a* as a second etch mask layer; and (2) patterning through a third etch method as is conventional in the art a gate dielectric layer 14*a* from the blanket gate dielectric layer 14 while employing the etched patterned photoresist layer 20*a*', the patterned focusing layer 18*a* and the gate electrode 16*a* as a third etch mask layer. As is understood by a person skilled in the art; the gate electrode 16*a* is typically and preferably patterned from the blanket layer of gate electrode material 16 formed of polysilicon or a polycide through either: (1) a chlorine containing second reactive ion etch (RIE) method; or (2) a chlorine containing second high density plasma (HDP) method. Similarly, the gate dielectric layer 14*a* is typically and preferably patterned from the blanket gate dielectric layer 14 through a fluorine containing third reactive ion etch (RIE) method. As is also understood by a person skilled in the art, for optimal performance of the method of the present invention, neither the second etch method nor the third etch method has a reproducible second etch bias or a reproducible third etch bias which substantially compensates for the reproducible negative etch bias of the patterned focusing layer 18*a* with respect to the patterned photoresist layer 20*a*. Preferably, the second etch method has a reproducible second etch bias and the third etch method has a reproducible third etch bias, where the reproducible second etch bias and the reproducible third etch bias are approximately zero (ie: from about 0.02 to about −0.02 microns each).

Figure 5:
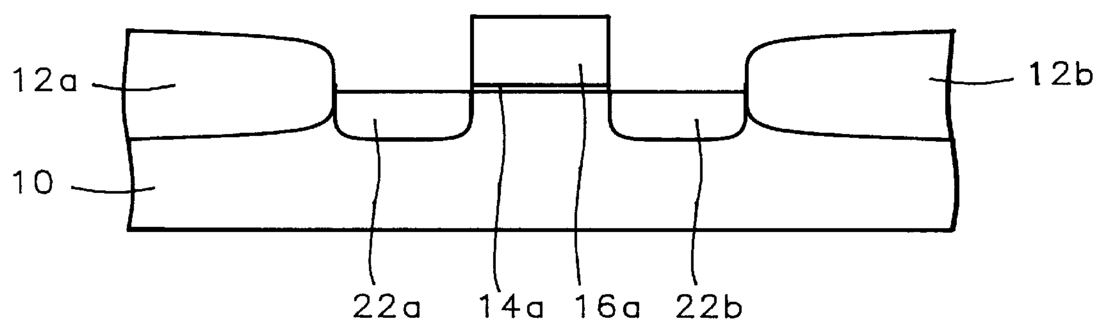

Referring now to FIG. 5, there is shown a schematic cross-sectional diagram illustrating the results of further processing of the integrated circuit whose schematic cross-sectional diagram is illustrated in FIG. 4. Shown in FIG. 5 is a schematic cross-sectional diagram of an integrated circuit otherwise equivalent to the integrated circuit whose schematic cross-sectional diagram is illustrated in FIG. 4 but from whose gate electrode 16*a* has been removed the etched patterned photoresist layer 20*a*' and the patterned focusing layer 18*a*. Methods through which layers such as the etched patterned photoresist layer 20*a*' and the patterned focusing layer 18*a* may be removed from integrated circuits are known in the art of integrated circuit fabrication. Methods through which layers such as the etched patterned photoresist layer 20*a*' and the patterned focusing layer 18*a* may be removed from integrated circuits typically include methods including but not limited to oxygen plasma stripping methods. Since within the preferred embodiment of the method of the present invention both the etched patterned photoresist layer 20*a*' and the patterned focusing layer 18*a* are formed of organic materials, they are both preferably sequentially stripped from the gate electrode 16*a* through an oxygen plasma stripping method as is known in the art of integrated circuit fabrication.

Finally, there is shown in FIG. 5 the presence of a pair of source/drain regions 22*a* and 22*b* formed into the active region of the semiconductor substrate 10 at areas not occupied by the gate dielectric layer 14*a* and the gate electrode 16*a,* thus forming within and upon the semiconductor substrate 10 a field effect transistor (FET). Methods and materials through which source/drain regions may be formed within field effect transistors (FETs) for use within integrated circuits are known within the art of integrated circuit fabrication. Source/drain regions are typically formed within integrated circuits through ion implantation methods employing a dopant ion of suitable polarity to the field effect transistor (FET) desired to be formed. For the preferred embodiment of the method of the present invention, the source/drain regions 22*a* and 22*b* are preferably formed through ion implanting a suitable dopant into the active region of the semiconductor substrate 10, while employing the gate oxide layer 14*a* and the gate electrode 16*a* as a mask, at an ion implantation dose of from about 1E13 to about 5E13 ions per square centimeter and an ion implantation energy of from about 30 to about 50 keV.

Upon forming the source/drain regions 22*a* and 22*b,* there is formed an integrated circuit having formed therein a field effect transistor (FET) where the gate electrode of the field effect transistor (FET) is formed with a linewidth as narrow as about 0.25 microns, while employing a near ultra-violet (NUV) (ie: 365 nanometer (nm)) photoexposure radiation method in forming the gate electrode within the field effect transistor (FET).

EXAMPLES

Upon each of three semiconductor substrates was formed a blanket layer of gate electrode material formed of a tungsten silicide polycide through a method as is conventional in the art. The three blanket layers of gate electrode material formed of the tungsten silicide polycide were about 2750 Angstroms thick each. Upon each of the three blanket layers of gate electrode material formed of the tungsten silicide polycide was formed a blanket focusing layer of an anti-reflective coating (ARC) material obtained from Brewer Science Inc., Rolla, Mo. as product ARC XRHi-11, although a functionally equivalent blanket focusing layer may also be formed of a similar anti-reflective coating (ARC) material obtained from Hoechst-Celanese Corporation, Sommerville, N.J. as product BARL-i. The three blanket focusing layers so formed were about 1400 Angstroms thick each. Finally, there was formed upon each of the three blanket focusing layers a blanket photoresist layer formed of a novolak positive photoresist material available from Mitsubishi Chemical Co., Tokyo, Japan as product i8200N photoresist material. The three blanket photoresist layers of the novolak positive photoresist material were about 7000 Angstroms thick each.

The three blanket photoresist layers upon the three blanket focusing layers were then photoexposed employing a near ultra-violet (NUV) (ie: 365 nanometer (nm)) photoexposure radiation method and developed through methods as are conventional in the art to yield a series of patterned photoresist lines upon each of the three blanket focusing layers. The series of patterned photoresist lines formed upon each of the three blanket focusing layers were of nominal linewidth about 0.33 to about 0.35 microns. The series of patterned photoresist lines upon a first of the three blanket focusing layers was separated by a nominal pitch of about 0.35 microns. Similarly, the series of patterned photoresist lines upon a second of the three blanket focusing layers was separated by a nominal pitch of about 0.40 microns. Finally, the series of patterned photoresist lines upon the third of the three blanket focusing layers was separated by a substantially isolating nominal pitch of greater than about 1.0 micron. The actual linewidths of the three series of patterned photoresist lines upon the three blanket focusing layers were measured employing a critical dimension-scanning electron microscope (CD-SEM) technique. The measured values for the actual linewidths of the three series of patterned photoresist lines are reported in TABLE I as P/R (photoresist ) ADI (after development inspection) measurement values.

The three blanket focusing layers on the three semiconductor substrates were then etched to form three patterned focusing layers while employing the three series of patterned photoresist lines as first etch mask layers, through a first high density plasma (HDP) etch method employing: (1) a reactor chamber pressure of about 5 mtorr; (2) a top radio frequency power of about 250 watts at a top radio frequency of 13.56 MHZ and a bottom radio frequency power of about 80 watts at a bottom radio frequency of 13.56 MHZ; (3) a substrate temperature of about 50 degrees centigrade; (4) a chamber temperature of about 40 degrees centigrade; (5) an oxygen flow rate of about 10 standard cubic centimeters per minute (sccm); and (5) a nitrogen flow rate of about 5 standard cubic centimeters per minute (sccm). Each of the three blanket focusing layers was etched for a time period of about 43 seconds, which included about 30 percent overetch.

The exposed portions of the three blanket layers of gate electrode material formed of the tungsten silicide polycide upon each of the three semiconductor substrates were then etched through a second high density plasma (HDP) method employing: (1) a reactor chamber pressure of about 4 mtorr; (2) a top radio frequency power of about 250 watts at a top radio frequency of 13.56 MHZ and bottom radio frequency power of about 170 watts at a bottom radio frequency of 13.56 MHZ; (3) a substrate temperature of about 65 degrees centigrade; (4) a chlorine flow rate of about 50 standard cubic centimeters per minute (sccm); and (5) a nitrogen background gas flow rate of about 4 standard cubic centimeters per minute (sccm), for a time period of about 24 seconds, which included about 75 percent overetch.

The remaining etched patterned photoresist lines and the remaining patterned focusing layers were then removed completely from the three semiconductor substrates through an oxygen plasma stripping method employing an oxygen plasma reactor at: (1) a reactor chamber pressure of about 10000 mtorr; (2) a radio frequency power of about 640 watts at a radio frequency of 13.56 MHZ; (3) a substrate temperature of about 250 degrees centigrade; and (4) an oxygen flow rate of about 800 standard cubic centimeters per minute (sccm), for a time period of about 90 seconds.

The remaining three series of patterned layers of gate electrode material formed from the tungsten silicide polycide upon the three semiconductor substrates were then finally cleaned through immersion in a 100:1 aqueous hydrofluoric acid solution for a time period of about 5 seconds, followed by deionized water rinsing and spin drying through methods as are conventional in the art.

The linewidths of the remaining three series of patterned lines within the patterned layers of gate electrode materials formed from the tungsten silicide polycide exposed upon the three semiconductor substrates were then measured through the same method and at the same locations as employed in measuring the linewidths of the three series of patterned photoresist lines upon the three semiconductor substrates. The linewidth measurements of the three series of tungsten silicide polycide lines are reported in TABLE I as polycide AEI (after etch inspection) measurement values. Finally, there is reported in TABLE I the etch bias which is calculated as the polycide AEI (after etch inspection) measurement values minus the corresponding photoresist ADI (after development inspection) measurement values.

TABLE I

| Example | Pitch (microns) | P/R ADI (microns) | Polycide AEI (microns) | Etch Bias (microns) |
|---|---|---|---|---|
| 1 | 0.35 | 0.346+/−0.048 | 0.257+/−0.033 | −0.088+/−0.026 |
| 2 | 0.40 | 0.320+/−0.026 | 0.236+/−0.025 | −0.084+/−0.028 |
| 3 | >1.0 | 0.330+/−0.039 | 0.258+/−0.037 | −0.072+/−0.022 |

From review of the data in Table I it is seen that through the blanket focusing layer etch method of the present invention there may be formed through employing a patterned photoresist layer having a nominal linewidth in the range of about 0.33 to about 0.35 microns (as formed through a near ultra-violet (NUV) (ie: 365 nanometer (nm)) photoexposure radiation method) a corresponding patterned polycide line of nominal linewidth as narrow as about 0.25 microns. Thus, through the method of the present invention there may be formed within integrated circuits electrical circuit elements and patterned layers of linewidth as narrow as about 0.25 microns while employing near ultra-violet (NUV) (ie: 365 nanometer (nm)) photoexposure radiation rather than deep ultra-violet (DUV) (ie: 248 nanometers (nm)) photoexposure radiation or x-ray photoexposure radiation.

What is claimed is:

1. A method for forming a patterned layer within an integrated circuit comprising:

providing a substrate;

forming upon the substrate a blanket target layer;

forming upon the blanket target layer a blanket focusing layer, the blanket focusing layer being formed of an organic material, the blanket focusing layer being susceptible to a reproducible negative etch bias with respect to a patterned photoresist layer employed as a first etch mask layer within a first etch method employed in forming from the blanket focusing layer a patterned focusing layer;

forming upon the blanket focusing layer a blanket photoresist layer;

photoexposing and developing the blanket photoresist layer to form the patterned photoresist layer;

etching with the first etch method the blanket focusing layer to form the patterned focusing layer while employing the patterned photoresist layer as the first etch mask layer, the patterned focusing layer having the reproducible negative etch bias with respect to the patterned photoresist layer; and etching while employing a second etch method the blanket target layer to form a patterned target layer while employing the patterned focusing layer as a second etch mask layer, the patterned target layer having a reproducible second etch bias with respect to the patterned focusing layer, where the reproducible second etch bias does not compensate the reproducible negative etch bias.

2. The method of claim 1 wherein the blanket target layer is chosen from the group of blanket target layers consisting of blanket conductor layers, blanket insulator layers, blanket semiconductor layers and blanket photoactive layers.

3. The method of claim 2 wherein the blanket target layer is from about 500 to about 10000 Angstroms thick.

4. The method of claim 1 wherein the organic material is an anti-reflective coating (ARC) material employed in attenuating reflections of a photoexposure radiation from the blanket target layer when forming from the blanket photoresist layer the patterned photoresist layer.

5. The method of claim 4 wherein the blanket focusing layer is from about 600 to about 2000 Angstroms thick.

6. The method of claim 4 wherein the blanket photoresist layer is photoexposed employing a near ultra-violet (NUV) 365 nanometer (nm) photoexposure radiation method and developed to yield the patterned photoresist layer of linewidth dimension about 0.33 to about 0.35 microns.

7. The method of claim 6 wherein the reproducible negative etch bias is from about −0.07 to about −0.09 microns and the reproducible second etch bias is approximately zero.

8. A method for forming a gate electrode for use within a field effect transistor (FET) within an integrated circuit comprising:

providing a semiconductor substrate;

forming upon the semiconductor substrate a blanket layer of gate electrode material;

forming upon the blanket layer of gate electrode material a blanket focusing layer, the blanket focusing layer being formed from an organic material, the blanket focusing layer being susceptible to a reproducible negative etch bias with respect to a patterned photoresist layer employed as a first etch mask layer within a first etch method employed in forming from the blanket focusing layer a patterned focusing layer;

forming upon the blanket focusing layer a blanket photoresist layer;

photoexposing and developing the blanket photoresist layer to form the patterned photoresist layer;

etching with the first etch method the blanket focusing layer to form the patterned focusing layer while employing the patterned photoresist layer as the first etch mask layer, the patterned focusing layer having the reproducible negative etch bias with respect to the patterned photoresist layer; and etching with a second etch method the blanket layer of gate electrode material to form a gate electrode while employing the patterned focusing layer as a second etch mask layer, the gate electrode having a reproducible second etch bias with respect to the patterned focusing layer, where the reproducible second etch bias does not compensate the reproducible negative etch bias.

9. The method of claim 8 wherein the blanket layer of gate electrode material is from about 1500 to about 3000 Angstroms thick.

10. The method of claim 8 wherein the organic material is an anti-reflective coating (ARC) material employed in attenuating reflections of a photoexposure radiation from the blanket layer of gate electrode material when forming from the blanket photoresist layer the patterned photoresist layer.

11. The method of claim 10 wherein the blanket focusing layer is from about 600 to about 2000 Angstroms thick.

12. The method of claim 10 wherein the blanket photoresist layer is photoexposed employing a near ultra-violet (NUV) 365 nanometer (nm) photoexposure radiation method and developed to yield the patterned photoresist layer of linewidth dimension about 0.33 to about 0.35 microns.

13. The method of claim 12 wherein the reproducible negative etch bias is from about −0.07 to −0.09 microns and the reproducible second etch bias is approximately zero.

14. The method of claim 13 wherein second etch method is a second reactive ion etch (RIE) method employing a chlorine containing etchant gas composition.

* * * * *